(12) United States Patent
Richmond et al.

(10) Patent No.: US 11,051,388 B2
(45) Date of Patent: Jun. 29, 2021

(54) X-RAY TUBE DIAGNOSTIC SYSTEM INCLUDING A CIRCUIT TO GENERATE A PHASE SIGNAL AND/OR AN INDICATION OF A STATUS OF A MOTOR

(71) Applicant: Varex Imaging Corporation, Salt Lake City, UT (US)

(72) Inventors: Michelle Richmond, Palo Alto, CA (US); Gary F. Virshup, Cupertino, CA (US); Dan Jones, Los Altos, CA (US)

(73) Assignee: Varex Imaging Corporation, Salt Lake City, UT (US)

( * ) Notice: Subject to any disclaimer, the term of this patent is extended or adjusted under 35 U.S.C. 154(b) by 0 days.

(21) Appl. No.: 16/024,841

(22) Filed: Jun. 30, 2018

(65) Prior Publication Data
US 2020/0008289 A1    Jan. 2, 2020

(51) Int. Cl.
*H05G 1/08* (2006.01)
*H05G 1/10* (2006.01)
(Continued)

(52) U.S. Cl.
CPC ............ *H05G 1/265* (2013.01); *G01M 13/04* (2013.01); *G01R 31/343* (2013.01); *H01J 35/06* (2013.01);
(Continued)

(58) Field of Classification Search
CPC ............ H05G 1/08; H05G 1/085; H05G 1/10; H05G 1/26; H05G 1/265; H05G 1/30;
(Continued)

(56) References Cited

U.S. PATENT DOCUMENTS 3,564,254 A * 2/1971 Siedband ................ H05G 1/66
378/94
3,641,408 A * 2/1972 Fiocca ..................... H05G 1/66
318/758

(Continued)

FOREIGN PATENT DOCUMENTS

| JP | 11-233287 | 8/1999 |
|---|---|---|
| JP | 2007-209194 | 8/2007 |
| KR | 10-2016-0039681 | 4/2016 |

OTHER PUBLICATIONS

PCT/US2019/039891, International Search Report dated Oct. 25, 2019.
(Continued)

*Primary Examiner* — Allen C. Ho
(74) *Attorney, Agent, or Firm* — Laurence & Phillips IP Law

(57) ABSTRACT

Some embodiments include a system, comprising: an enclosure configured to enclose a vacuum; a cathode disposed within the enclosure; an anode disposed within the enclosure configured to receive a beam of electrons from the cathode; a motor disposed within the enclosure and configured to rotate the anode in response to a drive input; and a circuit electrically connected to the drive input, and configured to generate a phase signal based on a voltage of the drive input and a current of the drive input, the phase signal indicating a phase difference between the voltage of the drive input and the current of the drive input.

20 Claims, 12 Drawing Sheets

(51) Int. Cl.
    *H05G 1/26*    (2006.01)
    *H05G 1/30*    (2006.01)
    *H05G 1/32*    (2006.01)
    *H05G 1/34*    (2006.01)
    *H01J 35/06*   (2006.01)
    *H01J 35/08*   (2006.01)
    *H01J 35/10*   (2006.01)
    *G01M 13/04*   (2019.01)
    *G01R 31/34*   (2020.01)

(52) U.S. Cl.
    CPC .............. *H01J 35/08* (2013.01); *H01J 35/10* (2013.01); *H01J 35/1017* (2019.05); *H01J 35/1024* (2019.05); *H05G 1/08* (2013.01); *H05G 1/085* (2013.01); *H05G 1/10* (2013.01); *H05G 1/26* (2013.01); *H05G 1/30* (2013.01); *H05G 1/32* (2013.01); *H05G 1/34* (2013.01); *H01J 35/101* (2013.01)

(58) Field of Classification Search
    CPC .... H05G 1/32; H05G 1/34; H05G 1/54; H01J 35/10; H01J 35/101; H01J 35/1017; H01J 35/1024; H01J 35/06; H01J 35/08
    USPC ................. 378/91, 125, 131, 132, 144, 207
    See application file for complete search history.

(56) References Cited

U.S. PATENT DOCUMENTS

| | | | | |
|---|---|---|---|---|
| 3,963,930 A * | 6/1976 | Fiocca | ............... | H05G 1/66 378/94 |
| 3,968,413 A * | 7/1976 | Fiocca | ............... | 378/93 |
| 4,259,580 A * | 3/1981 | Vogler | ............... | H05G 1/58 378/94 |
| 4,890,058 A * | 12/1989 | Trenkler | ............... | G01R 31/343 324/765.01 |
| 4,914,683 A * | 4/1990 | Tanaka | ............... | H05G 1/66 378/101 |
| 5,049,815 A * | 9/1991 | Kliman | ............... | G01R 31/343 324/545 |
| 5,105,141 A * | 4/1992 | Ernest | ............... | H05G 1/66 318/805 |
| 5,519,337 A * | 5/1996 | Casada | ............... | G01R 31/343 324/545 |
| 5,565,752 A * | 10/1996 | Jansen | ............... | H02K 17/165 310/169 |
| 5,696,804 A * | 12/1997 | Ono | ............... | A61B 6/032 378/125 |
| 5,774,625 A * | 6/1998 | Vogler | ............... | G01P 3/46 318/458 |
| 5,883,487 A * | 3/1999 | Rosenzweig | ............... | G01P 3/48 318/459 |
| 6,141,401 A | 10/2000 | Gerling | | |
| 6,708,134 B2 * | 3/2004 | McGaughey | ............... | H02P 21/18 318/700 |
| 7,224,768 B2 * | 5/2007 | Domoto | ............... | H05G 1/56 378/93 |
| 7,302,041 B2 * | 11/2007 | Deuringer | ............... | G01R 31/257 378/117 |
| 7,701,215 B2 * | 4/2010 | Lillaney | ............... | G01R 33/381 324/318 |
| 7,885,384 B2 * | 2/2011 | Mannar | ............... | H05G 1/54 378/118 |
| 7,911,170 B2 * | 3/2011 | Hauttmann | ............... | H02K 17/30 318/490 |
| 8,542,800 B2 * | 9/2013 | Biehr | ............... | H02K 11/225 378/131 |
| 8,571,505 B2 | 10/2013 | Jin | | |
| 8,588,371 B2 * | 11/2013 | Ogawa | ............... | H05G 1/20 378/101 |
| 9,107,280 B2 * | 8/2015 | Hishikawa | ............... | H01J 35/10 |
| 9,198,709 B2 | 12/2015 | Cox et al. | | |
| 9,314,221 B2 | 4/2016 | Katcha et al. | | |
| 9,603,230 B2 * | 3/2017 | Wiedmann | ............... | H05G 1/265 |
| 2005/0226384 A1 | 10/2005 | Domoto et al. | | |
| 2009/0212775 A1 | 8/2009 | Lillaney et al. | | |

OTHER PUBLICATIONS

PCT/US2019/039891, Written Opinion of International Search Authority dated Oct. 25, 2019.

* cited by examiner

X-RAY TUBE DIAGNOSTIC SYSTEM INCLUDING A CIRCUIT TO GENERATE A PHASE SIGNAL AND/OR AN INDICATION OF A STATUS OF A MOTOR

BACKGROUND

This disclosure relates to x-ray tubes, systems including x-ray tubes, and diagnostic techniques for such tubes and systems.

X-ray tubes are used in a variety of applications. Some x-ray tubes have rotating structures, such as a rotating anode. The anode is rotated by a motor contained within a vacuum enclosure of the x-ray tube. Over time, the motors may fail and hence, cause the x-ray tube to fail. When the x-ray tube fails, it may be replaced. However, there may be no warning of the failure.

DETAILED DESCRIPTION

The failure of an x-ray tube may lead to interrupted procedures and/or undesirable down-time while waiting for the x-ray tube to be replaced. For example, a system integrator may treat an x-ray tube similar to a light bulb, i.e., when it fails, it is replaced. The time from failure to replacement may result in undesirable interruptions and/or down-time, particularly when unexpected failures of the x-ray tube occur. However, by monitoring the x-ray tube to predict a failure of the x-ray tube as described herein, the interruptions and/or undesirable down-time may be reduced or eliminated. As will be described in further detail below, in some embodiments, various parameters of a motor within an x-ray tube may be monitored either directly or indirectly and used to predict a failure of the x-ray tube. This warning may allow for a scheduled replacement of an x-ray tube, such as during a time that a system including the x-ray tube is not in use. As a result, up-time for the x-ray system may be increased.

Figure 1A:
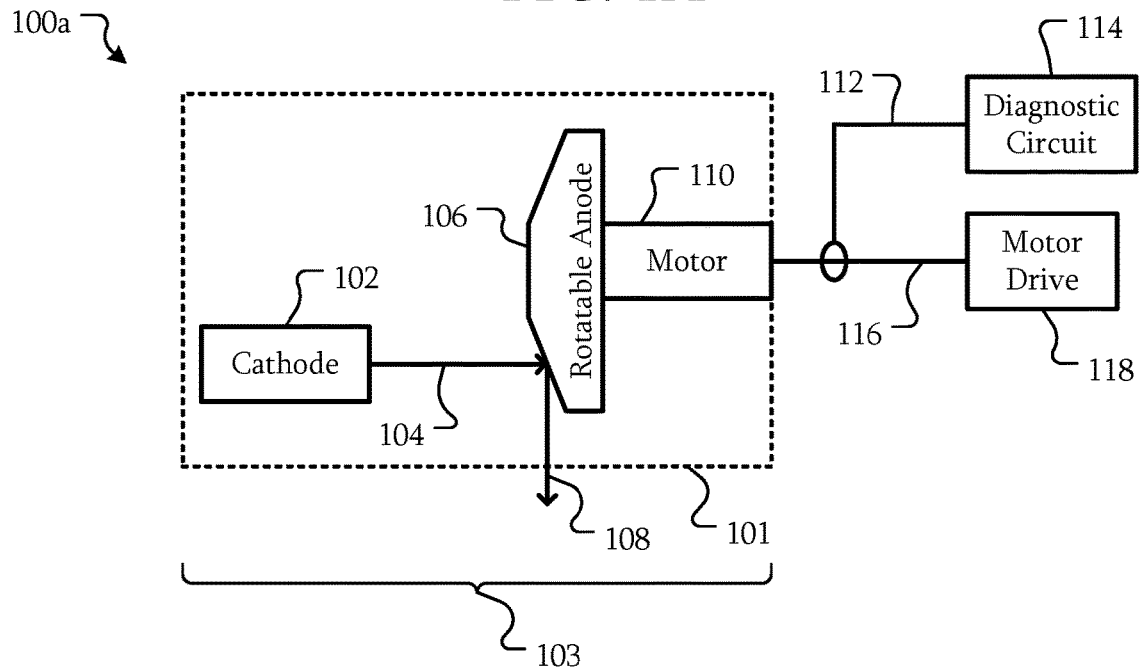
FIGS. 1A-B are block diagrams of systems according to some embodiments.
Figure 1B:
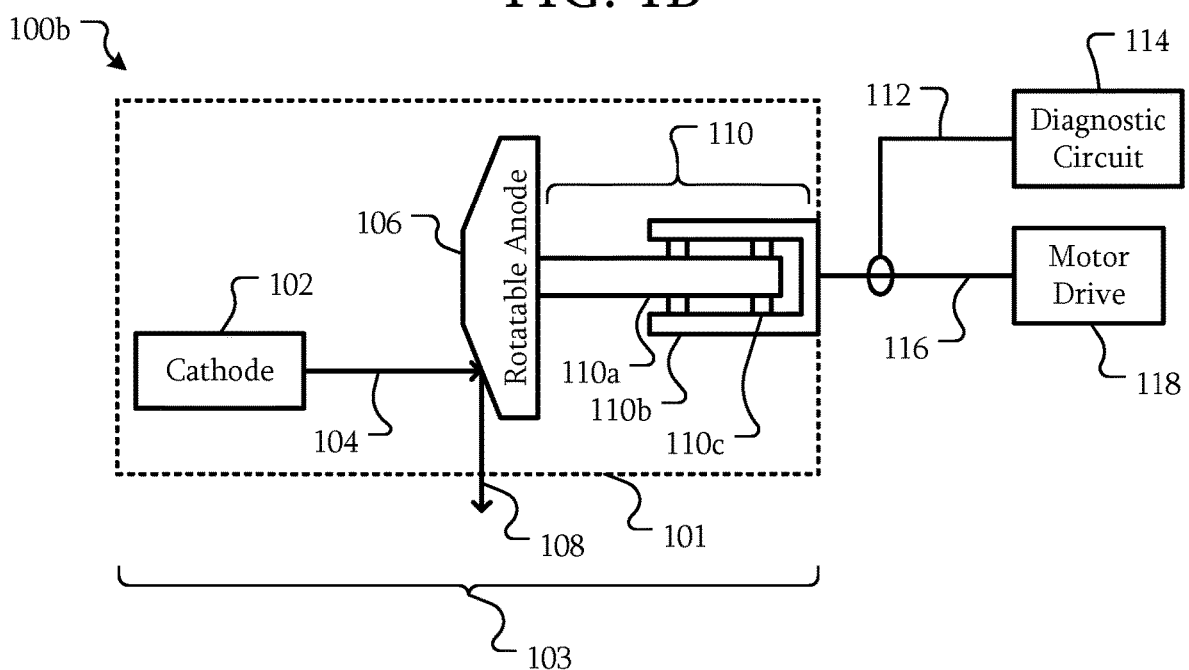

FIGS. 1A-B are block diagrams of systems according to some embodiments. Referring to FIG. 1A, in some embodiments, a system 100a includes an enclosure 101 configured to enclose a vacuum. This enclosure 101 may be a housing of an x-ray tube 103. Disposed within the enclosure 101 are a cathode 102, a rotatable anode 106, and a motor 110.

The cathode 102 is configured to generate a beam 104 of electrons. Other structures, circuitry, or the like may be present to generate, form, and/or guide the beam 104. For example, beam focusing and positioning magnetics may be disposed in the enclosure 101 relative to the cathode 102 to create the desired beam 104 of electrons. For simplicity, such components are not illustrated.

The beam 104 is directed towards the rotatable anode 106. The rotatable anode 106 is configured to be rotated by the motor 110. The rotatable anode 106 is configured to receive the beam 104 and generate x-rays 108 in response.

The motor 110 is disposed within the enclosure 101. The motor 110 is configured to receive a drive input 116 from a motor drive 118. The drive input 116 is a power input used to drive the motor 110. In some embodiments, the motor 110 is an induction motor; however, in other embodiments, other types of motors may be used.

The system 100a also includes a diagnostic circuit 114. The diagnostic circuit 114 is a circuit including inputs for one or more sensed signals 112, such as sensed voltages, currents, accelerations, rotational velocities, or the like associated with the system 100a.

The diagnostic circuit 114 may be disposed at least in part or entirely outside of the enclosure 101. The diagnostic circuit 114 is electrically connected to the drive input 116 for the motor 110. Here, the diagnostic circuit 114 is configured to receive sensed signals 112 from the drive input 116. The diagnostic circuit 114 may be electrically connected to a cable connecting the motor drive 118 to the motor 110, electrically connected to terminals of the motor 110 at a wall of the enclosure 101, electrically connected to the motor drive 118, or the like.

The diagnostic circuit 114 may include a general-purpose processor, a digital signal processor (DSP), an application specific integrated circuit, a microcontroller, a programmable logic device, discrete circuits, a combination of such devices, or the like. The diagnostic circuit 114 may be a stand-alone circuit or may be in part or in whole integrated with other control systems of the system 100a. For example, the diagnostic circuit 114 may be part of an x-ray tube controller, a system controller, or the like. The diagnostic circuit 114 can be coupled to a communication module (not shown) that provides an output of the diagnostic circuit 114 to a user or other mechanism to provide status information, notify a user that a replacement is recommended, or the like. The communication module may be part of the x-ray tube controller, a system controller, or the like. The diagnostic circuit 114 may also include a memory such as a dynamic random access memory (DRAM), a static random access memory (SRAM), an electrically erasable programmable read-only memory (EEPROM), a flash memory, or the like. The diagnostic circuit 114 may be configured to store configuration information, historical measurements, diagnostic information, or the like in the memory. The diagnostic circuit 114 may also include timers, comparators, or the like.

In some embodiments, the diagnostic circuit 114 includes sensors configured to sense voltages, currents, sound, vibration, or the like. In other embodiments, the diagnostic circuit 114 is coupled to such sensors. In other embodiments, such sensors are distributed between the diagnostic circuit 114 and the other circuits. Various embodiments will be described below with sensors separate from the diagnostic circuit 114; however, in other embodiments, the sensors may be distributed as described above.

As will be described in further detail below, the diagnostic circuit 114 may be configured to receive or generate a phase signal based on a voltage of the drive input 116 and a current of the drive input 116. The phase signal indicates a phase difference between the voltage of the drive input 116 and the current of the drive input 116. In induction motors, the phase signal may indicate a load or a change in the load of the motor 110.

Referring to FIG. 1B, the system 100b may be similar to the system 100a and include similar components. The motor 110 may include a rotor 110a, a stator 110b, and bearings 110c. The rotor 110a may be coupled to the rotatable anode 106 such that when the rotor 110a rotates, the rotatable anode 106 rotates. The rotor 110a is rotatably coupled to the stator 110b through the bearings 110c. These bearings 110c are an example of a portion of the motor 110 that may wear and eventually cause a failure of the system 100b.

In some motors 110, the stator 110b and rotor 110a are coupled inductively, such as in an induction motor. As a result, there is a phase difference between the drive current in the stator 110b windings and the drive voltage that drives the current. In particular the phase difference between the stator 110b drive voltage and drive current may vary due to bearing wear. The stator 110b resistance has a real component and an imaginary component. The real component is mostly the resistance of the stator 110b windings. The imaginary component is due to the inductive coupling to the rotor 110a. The inductive resistances may be related to the frequency of the power supplied to the stator 110b and the rotational frequency of the rotor 110a.

The motor 110 may cause the rotatable anode 106 to rotate at various different speeds. For example, the motor 110 may cause the rotatable anode 106 to rotate at a frequency of between 1 and 200 Hz. In another example, the frequency may be between 50 and 180 Hz. This rotation may spread the instantaneous power of the beam 104 received by the rotatable anode 106 over a larger effective area. As the motor 110 and the rotatable anode 106 are rotating continuously to achieve the effect of spreading the power of the beam 104, the failure of the motor 110 and in particular, the bearings 110c, may cause an x-ray tube 103 including the motor 110 to fail.

Measuring and identifying changes in the operation of the bearings 110c may be used predict the end of life of the bearings 110c and hence, the motor 110 and the x-ray tube 103. A change in the relative phase of a current and a voltage of the drive input 116 of the motor 110, for fixed operating conditions, may indicate a change in the status of the bearings 110c. The change may include increased wear causing more friction. The magnitude of the relative phase may increase as the wear increases to overcome the increased friction.

Predicting bearing failure in x-ray tubes 103 may be more difficult or impossible when compared with other environments. Within the operating environment of an x-ray tube 103, sensors may be difficult or impossible to implement. For example, voltages within an x-ray tube 103 may be on the order of tens to hundreds of kilovolts (kV) or more. The x-ray tube 103 may be subjected to high heat, such as the heat from the cathode 102, heaters, or the like. In addition, the moving parts of the motor 110 may be surrounded by a non-conductive or high resistivity oil for cooling purposes. The x-ray tube 103 may be subject to high magnetic fields. The x-ray tube 103 may be metallic and prevent external sensing of internal structures through optical or magnetic techniques. In addition, high electric fields within an x-ray tube 103 may introduce problems of arcing if a rotating structure was used to sense an attribute of the motor 110. In circumstances where a motor 110 is not subject to a high vacuum, high heat, high voltages, magnetic fields, or the like, a sensor that is able to determine top-dead-center of the rotor 110a or other sensors may be mounted on the motor 110.

By using a system as described herein, a sensor may be placed in a less harsh environment. In addition, in some embodiments, a system described herein may be coupled to a conventional x-ray tube 103 and the information may be obtained and related predications may be generated. That is, a change to the x-ray tube 103 and, in particular, a change to the internal components and structures of the x-ray tube 103 may not be needed to realize the benefit of a system described herein.

In some embodiments, the diagnostic circuit 114 is configured to sense any failure that increases a load on the motor 110. A change in the phase shift between the drive current and drive voltage may indicate that something has caused an increase in the load on the motor 110. As will be described in further detail below, the phase may be compared with a calibrated value or range for a particular set of operating conditions. In some embodiments, a value or range may be provided for each set of operating conditions that may result in a different value or range during normal operation. In a particular example, a value or range for the phase may be set for each combination of anode 106 frequency and gantry centripetal acceleration. If the phase changes from the particular value or passes outside of the particular range, that change may indicate a failure, such as excessive wear on the bearings 110c.

Figure 2A:
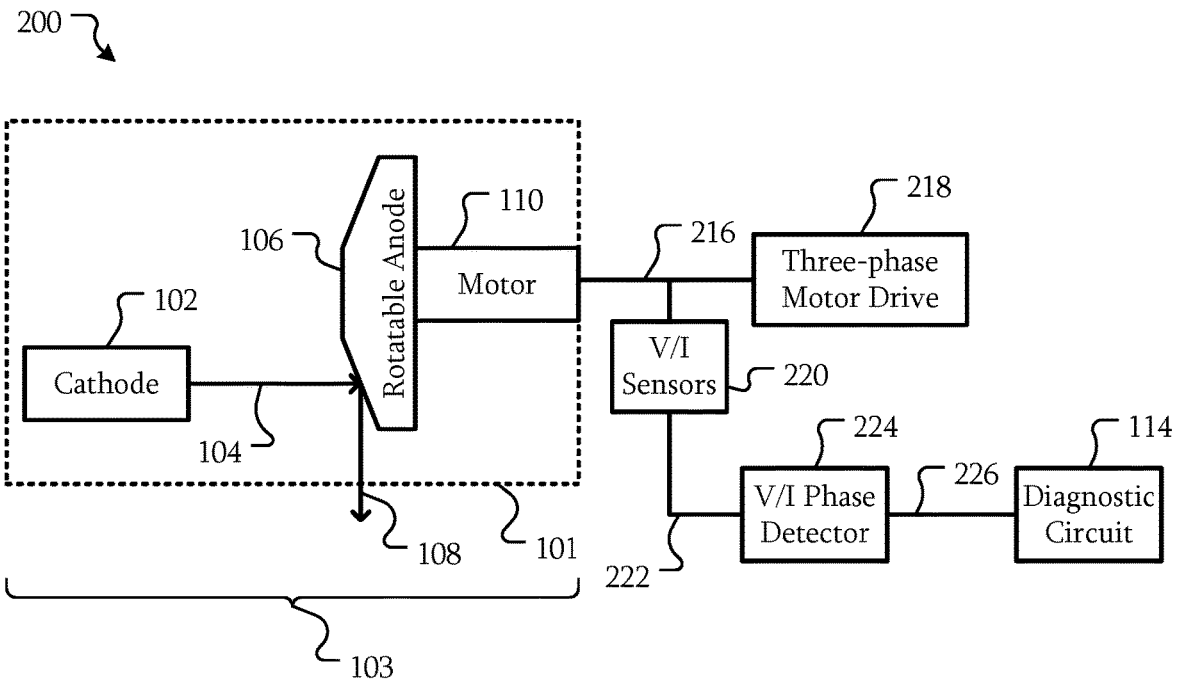
FIG. 2A is a block diagram of a system with three-phase power according to some embodiments.
Figure 2B:
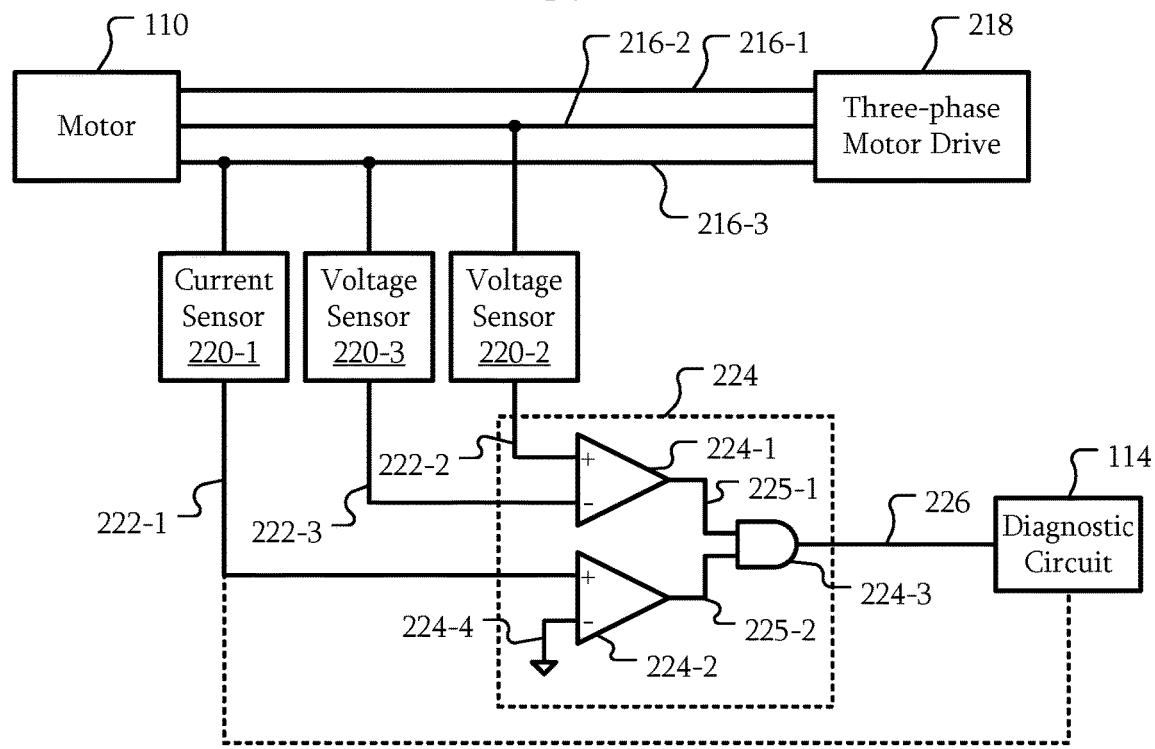
FIG. 2B is a block diagram of an example of sensors and phase detector of FIG. 2A according to some embodiments.

FIG. 2A is a block diagram of a system 200 with three-phase power according to some embodiments. The motor 110 may be configured in a delta (Δ) or wye (Y or star) configuration. FIG. 2B is a block diagram of an example of sensors and phase detector of FIG. 2A according to some embodiments. Referring to FIGS. 2A-B, in some embodiments, the system 200 may be similar to the system 100a or 100b of FIG. 1A or 1B. However, the motor drive 118 is a three-phase motor drive 218. The three-phase motor drive 218 is a circuit configured to generate drive input 216 having three sinusoidal drive voltages 216-1 to 216-3 that are each phase shifted by about 120 degrees. The motor 110 is a three-phase motor configured to operate using such three-phase voltages.

Voltage and current (V/I) sensors 220 are configured to sense one or more voltages and one or more currents of the drive input 216. The specific example of FIG. 2B includes one current sensor 220-1 and two voltage sensors 220-2 and 220-3.

The current sensor 220-1 may be any variety of circuit that may generate a signal based on a current. For example, the current sensor 220-1 may be a hall-effect sensor, a series resistor and circuitry to transform the measure the voltage drop across the resistor, or the like. The current sensor 220-1 is configured to sense a current flowing through the connection between the three-phase motor drive 218 and the motor 110 to which the drive voltage 216-3 is applied.

The voltage sensors 220-2 and 220-3 may be any variety of circuit that may generate a signal based on a voltage. For example, the voltage sensors 220-2 and 220-3 may include a tap resistor, a transformer, or the like. The voltage sensor 220-2 is configured to sense a voltage of drive voltage 216-2 to generate voltage signal 222-2. Similarly, the voltage sensor 220-3 is configured to sense a voltage of drive voltage 216-3 to generate voltage signal 222-3. The sensors 220 described herein such as the current sensor 220-1 and voltage sensors 220-2 and 220-3 may also include other circuitry to appropriately transform the currents, voltages, or the like into forms suitable for downstream circuitry.

In some embodiments, the V/I sensors 220 may be part of a power cable between the three-phase motor drive 218 and the motor 110. However, in other embodiments, one or more of the V/I sensors 220 may be disposed in other location and/or distributed between the power cable and other circuitry.

The V/I phase detector 224 is a circuit configured to generate a phase signal 226 indicative of the relative phase of a voltage and a current. The particular example of FIG. 2B includes two comparators 224-1 and 224-2. The comparators 224-1 and 224-2 are each configured to generate a digital output based on the comparison of two signals. Comparator 224-1 is configured to compare sensed voltage signal 222-2 to sensed voltage signal 222-3. The output 225-1 is a digital signal indicating which is greater. Accordingly, the output 225-1 is a pulse train that switches when sinusoidal drive voltages 216-2 and 216-3 cross. As a result, the output 225-1 has a particular phase relationship to the drive voltage 216-3.

Comparator 224-2 is configured to compare the sensed current signal 222-1 with a threshold 224-4. In some embodiments, the threshold 224-4 is ground; however, in other embodiments, the threshold 224-4 may be different. As a result of the comparison, the output 225-2 is a pulse train that switches when the current associated with drive voltage 216-3 crosses the threshold 224-4. Accordingly, the output 225-2 has a particular phase relationship with the current associated with drive voltage 216-3.

Both outputs 225-1 and 225-2 are combined in AND gate 224-3. The output 226 is a phase signal 226 with a pulse having a width representative of the phase shift between the drive voltage 216-3 and the associated current.

Figure 2C:
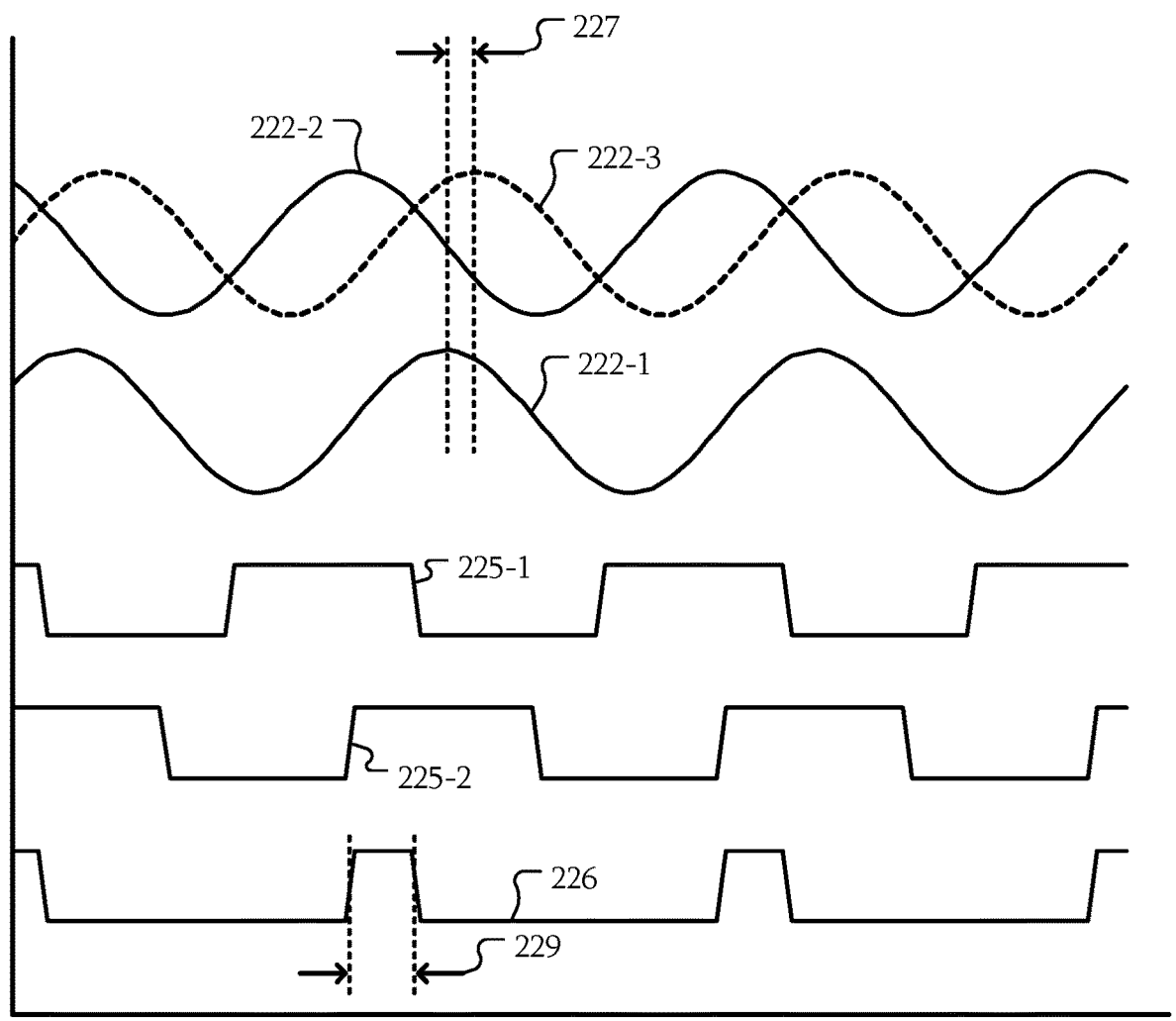
FIG. 2C is a chart illustrating examples of voltages, currents, and logic signals in the circuit of FIG. 2B.

FIG. 2C is a chart illustrating examples of voltages, currents, and logic signals in the circuit of FIG. 2B. An example of the sensed current 222-1 associated with drive voltage 216-3 and examples of the sensed voltages 222-2 and 222-3 corresponding to the two drive voltages 216-2 and 216-3 are illustrated. The sensed drive voltages 222-2 and 222-3 are out of phase by 120 degrees. The sensed current 222-1 is out of phase from the associated sensed drive voltage 222-3 by phase shift 227. In particular, the sensed current 222-1 lags the sensed drive voltage 222-3 by the phase shift 227.

Output 225-1 is a pulse train with transitions aligned to the crossings of the sensed drive voltages 222-2 and 222-3. Output 225-2 is a pulse train with transitions aligned to the zero-crossings of the sensed current 222-1. Output 226 is the result of the logical AND of outputs 225-1 and 225-2. The resulting pulse has a width 229. This width is dependent on the relative phase 227. As the phase lag of the sensed current 222-1 increases, i.e., the phase 227 increases, the rising edge of the output 225-2 will have a correspondingly increased lag. As a result, the leading edge of the pulse in the output 226 will have a correspondingly increased lag, increasing the pulse width 229.

In some embodiments, the pulse in the output 226 will have a non-zero width 229 even if there is a zero phase-shift between the sensed drive voltage 222-3 and the sensed current 222-1. However, in other embodiments, the circuit may be configured differently. Moreover, although particular polarities of signals and two particular voltages 216-2 and 216-3 have been used as examples, in other embodiments, different polarities and different voltages may be used. Although the absolute value of the pulse width 229 may be different, the relative change and/or the absolute value may still be detected.

As described above, this phase shift 227 may represent a load on the motor 110. The phase shift 227 is encoded in the pulse width 229 of the phase signal 226. The diagnostic circuit 114 may be configured to measure the pulse width 229. Accordingly, the diagnostic circuit 114 has a value available representative of the relative or absolute phase of a current and voltage of the drive input 116 that may be used for diagnostic purposes. For example, the diagnostic circuit 114 may include a microcontroller, particular circuitry, software, or the like to transform a pulse of the phase signal 226 into a digitized value. In a particular example, each of the rising and falling edge of the pulse may trigger reading of a clock value. The difference of those two corresponding values may indicate the pulse width 229 and hence, the phase shift 227.

The diagnostic circuit 114 may be configured to further process or accumulate the phase signal 226. For example, the diagnostic circuit 114 may be configured to output a running average of the widths of the pulses of the phase signal 226 over a one second interval. In another example, the widths of less than all of the pulses of the phase signal 226 may be digitized. In other embodiments, other processing techniques may be performed.

In some embodiments, the two voltages 216-2 and 216-3 are sensed and compared to reduce noise. For example, comparing the voltages 216-2 and 216-3 will provide phase information as the relative phase of the two voltages is fixed. However, common mode noise present on both may be reduced or eliminated.

Although a particular example of a V/I phase detector 224 has been described, in other embodiments, other circuits may be used. Any circuit that can generate a pulse with a width that indicates a relative phase may be used as the V/I phase detector 224. In addition, the output need not be in the form of a pulse. For example, the output 226 may be an analog signal or a digital signal indicative of the relative phase. In some embodiments, the pulses in phase signal 226 may be filtered with a low-pass filter to generate an analog phase signal.

In some embodiments, the V/I phase detector 224 may be implemented in the diagnostic circuit 114. For example, the diagnostic circuit 114 may include digitizing circuitry, such as analog to digital converters, to digitize each of the sensed current 222-1 and sensed voltages 222-2 and 222-3. The diagnostic circuit 114 may be configured to perform operations similar to those performed by the V/I phase detector 224 or other operations. In addition, the diagnostic circuit 114 may have other attributes of the drive input 216 available, such as the frequency of the voltages 216, the amplitude of the voltages 216, the amplitude of the current of one or more of the voltages 216, or the like.

Figure 3A:
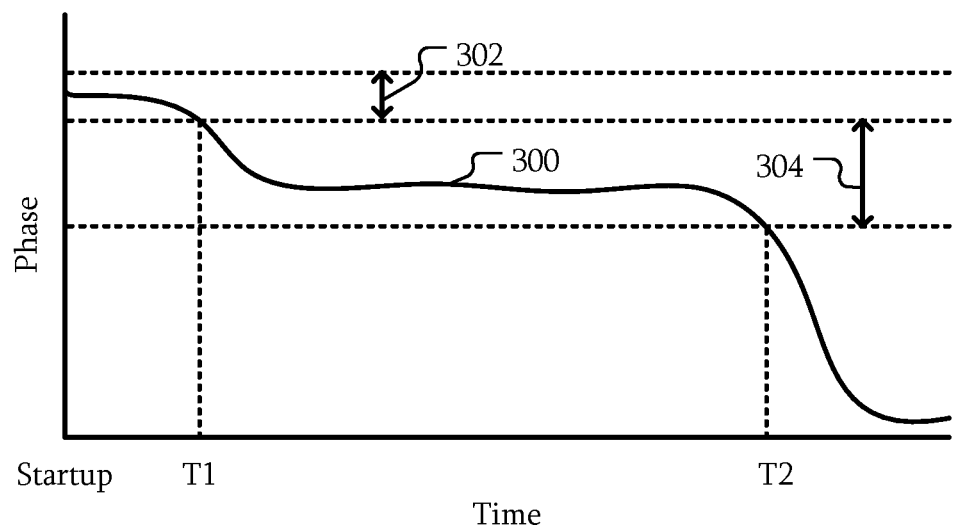
FIGS. 3A-3C are charts illustrating examples of signals used in diagnosing an x-ray tube according to some embodiments.
Figure 3B:
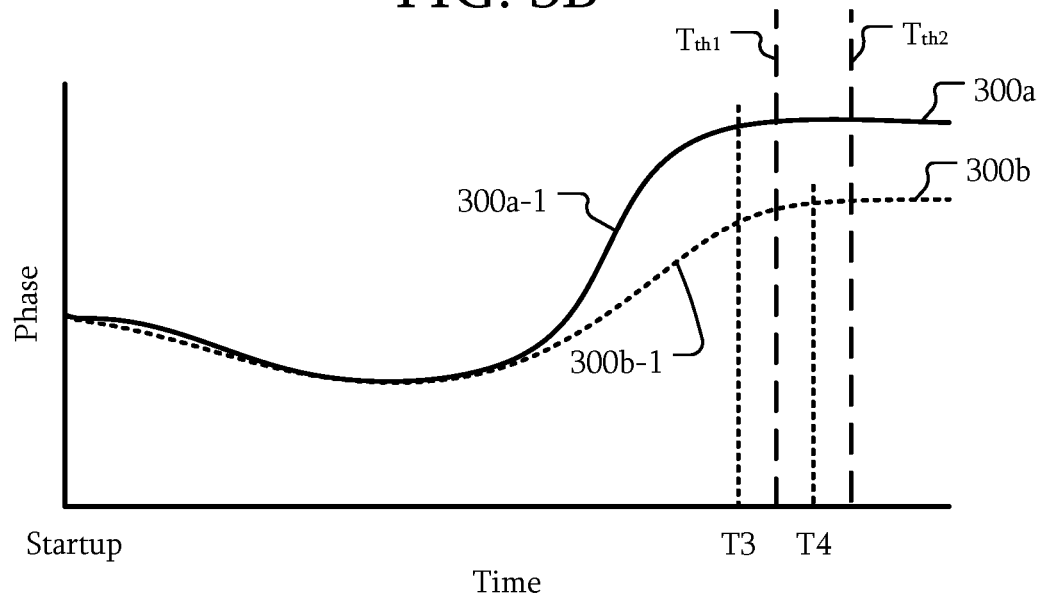
Figure 3C:
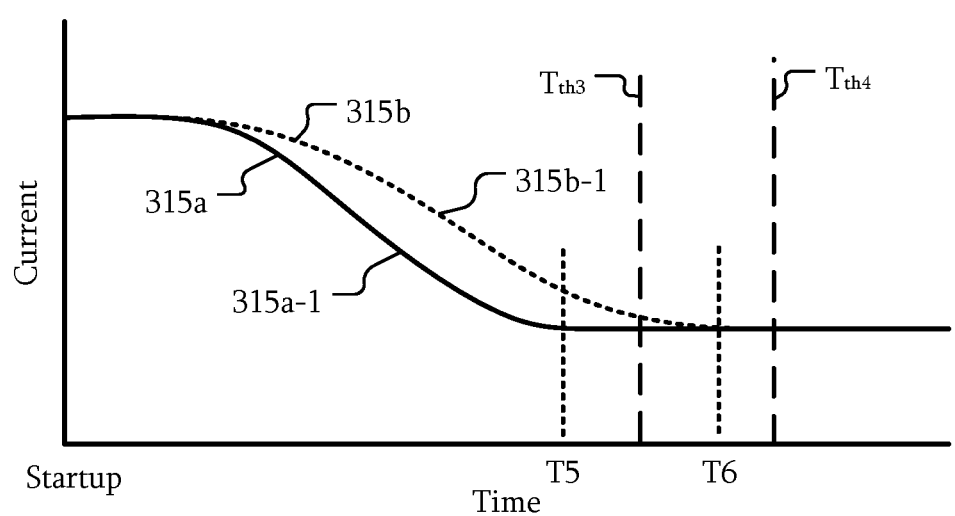

FIGS. 3A-3C are charts illustrating examples of signals used in diagnosing an x-ray tube according to some embodiments. Using techniques similar to those described herein, the diagnostic circuit 114 may be configured to generate an indication of a status of the motor 110. FIG. 3A is a chart illustrating an example of a phase 300 for a set of operating conditions. The phase 300 may be the digitized pulse width 229 that has been acquired and processed as described above. For example, the phase 300 may be the width of the pulse 229 in milliseconds (ms).

In some embodiments, the diagnostic circuit 114 compares the phase 300 representing a relative phase shift between a drive voltage 216 and the corresponding current to one or more ranges. In some embodiments, the system may be calibrated to determine one or more ranges. In other embodiments, the initial steady state of the phase 300 may be used to generate one or more ranges. Here a first range 302 represents an acceptable operating range given the particular operating conditions. In a particular example, a system in good condition may be operated to generate a baseline phase shift. That phase shift may be used to generate the range 302 representing the acceptable range. In some embodiments, the range 302 is a range that if the system continues to operate in that range 302 for the particular operating conditions, the system may operate indefinitely with respect to the monitored components.

Range 304 represents an operating range for the phase 300 where a failure may occur in a predictable amount of time. If the measured phase 300 changes to enter the range 304, the diagnostic circuit 114 may predict that the system will soon fail. The diagnostic circuit 114 may generate a predicted remaining lifetime. For example, the diagnostic circuit 114 may have access to statistical data on the remaining lifetime after a system's phase 300 enters the range 304. In a particular example, the system may combine a mean time to failure from the time of entering range 304 reduced by zero or more standard deviations from the statistical data.

In some embodiments, the phase 300 may leave the range 304. Outside of the range 302 and 304 may represent a phase shift for given operating conditions that the system is failing or has already failed.

In FIG. 3A, times T1 and T2 are used as examples of times at which the phase 300 shifts out of range 302 and out of range 304, respectively. For example, at the beginning of operation, the phase 300 may be within the range 302. At this point, the system may not have a predictable remaining lifetime. However, at about time T1, something changes, such as increased wear on motor bearings, that causes a change in the phase 300 to move out of the range 302. At this time, the system may have a finite, predictable lifetime remaining.

The system may operate in this condition; however, at some point, the wear may increase to cause the system to fail. Time T2 represents that point where the phase 300 moves out of the range 304. The difference between times T1 and T2 may be particular the given system. That is, while the difference may be related to a predicted remaining lifetime, the actual remaining lifetime may be different.

The relative magnitudes of times T1 and T2 may be different than that illustrated. For example, time T1 may be relatively large as compared with the time between time T2 and time T1. The times here are used solely for illustration.

In some embodiments, the phase 300 may be filtered or otherwise processed by the diagnostic circuit to remove false positives. For example, if expected transient changes in the phase 300 may cause the phase 300 to move out of range 302 or 304, the phase 300 may be filtered by the diagnostic circuit 114 to ignore or reduce the impact of such transients.

As described above, the phase shift 300 may be dependent on the particular operating conditions. Using the anode 106 rotational frequency and the gantry centripetal acceleration as examples of operating conditions, the diagnostic circuit 114 may include ranges 302 and 304 that are particular to each combination of rotational frequency and gantry centripetal acceleration. In other embodiments, an equation may be used to generate the ranges 302 and 304 for a given set of operating conditions. In other embodiments, the ranges 302 and 304 may be based on interpolating between ranges 302 and 304 for a finite set of operating conditions. The ranges 302 and 304 may be generated in other ways. In addition, although two ranges 302 and 304 are used as examples, in other embodiments, one range or more than two ranges may be used.

Although anode rotational frequency and the gantry centripetal acceleration have been used as examples of operating conditions that may affect the phase shift 300 in normal operation, in other embodiments, other conditions may be used in addition or instead of one or more of these examples. For example, a gantry rotational speed, motor 110 drive frequency, motor 110 drive voltage, or other operating conditions may be used as an operating condition that affects the ranges 302 and 304 or similar ranges.

FIG. 3B is a chart illustrating a diagnostic technique using a change in the phase from a startup. Two example phases 300a and 300b are illustrated. Phase 300a is an example of a phase measured from a system that is operating normally. Phase 300b is an example of a phase measured from a system that has a limited, predicted lifetime remaining, is failing, or has failed.

In particular, the phase 300a reaches a steady state by time T3 from startup and has a particular maximum rate of change of the phase 300a at 300a-1. Similarly, phase 300b reaches a steady state by time T4 from startup, which is longer than time T3. In addition, phase 300b has a maximum rate of change 300b-1 that is less than the rate of change 300a-1.

A steady state may be defined in a variety of ways. For example, a steady state may be an absolute change from one measurement to the next that is below a threshold. In another example, a steady state may be a relative change, such as a percentage of the change from startup, that is less than a threshold. In another example, an amount of change over time that is below a threshold may indicate a steady state. In another example, a magnitude of a derivative of the measured signal over time or a magnitude of a derivative of a difference between the measured signal and an expected signal that is below a threshold may indicate a steady state.

One or both of the time to steady state and the rate of change of the phase may be used similarly to or in addition to the steady state values of the phase described above. For example, the diagnostic circuit 114 may include threshold times $T_{th1}$ and $T_{th2}$. Threshold time $T_{th1}$ that defines a division between systems that are operating normally and systems that may fail or are in the process of failing. Threshold time $T_{th2}$ may define a division between systems that may fail in a given remaining lifetime and systems that are in the process of failing or have failed. Accordingly, with a given set of operating conditions, different aspects of the phase may be another indicator of bearing status.

Referring back to FIG. 2B, in some embodiments the diagnostic circuit 114 may be configured to receive the sensed current value 222-1. The dashed line represents the optional connection. As described above, the diagnostic circuit 114 may be configured to digitize the sensed current 222-1. FIG. 3C is a chart illustrating a diagnostic technique using a change in the current from a startup. Similar to the time to steady state and the rate of change of the phase described above with respect to FIG. 3B, the time to steady state and the rate of change of the current may be used as an indicator of the status of the motor and/or the system. For example, current 315a represents a current driving the motor 110 from startup to steady state having a maximum rate of change 315a-1. The time to steady state is time T5. Similarly, current 315b represents a current driving the motor 110 from startup to steady state by time T6 having a maximum rate of change 315b-1. Current 315a represents a system that is operating normally. Current 315b represents a current in a system that is likely to fail or is in the process of failing. Similar to FIG. 3B, a threshold time $T_{th3}$ can be used to distinguish between systems that are operating normally and a system that may fail. Another threshold time $T_{th4}$ may also be used to distinguish between systems that have a limited, predictable lifetime remaining and those that are failing or have failed. Here, the time T5 is less than the threshold time $T_{th3}$ and indicates that the associated system is operating normally. The time T6 is greater than the threshold time $T_{th3}$ and is less than the threshold time $T_{th4}$ indicates that the system may have a limited, predictable lifetime remaining.

Although in FIGS. 3A-3C, the change of the phase or current has been illustrated as changing in a particular direction over time, in other embodiments, the change may be in the opposite direction. Moreover, the direction of the change may also change based on operating conditions.

Figure 4:
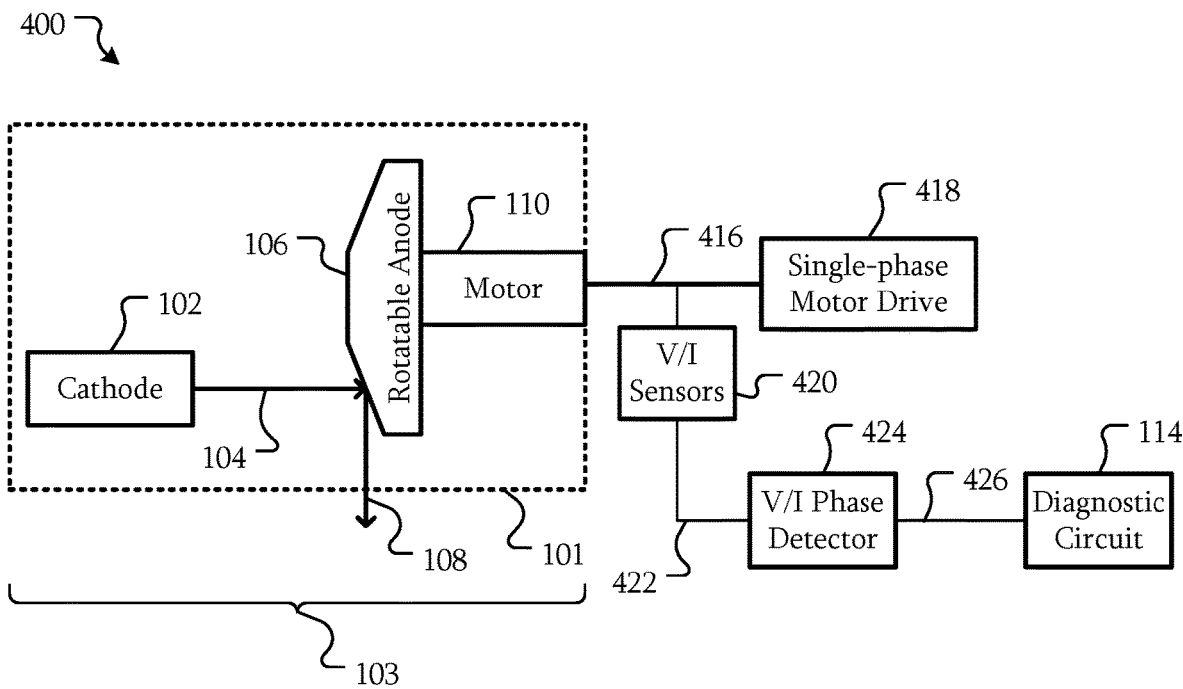
FIG. 4 is a block diagram of a system with single-phase power according to some embodiments.

FIG. 4 is a block diagram of a system with single-phase power according to some embodiments. The system 400 may be similar to the system 200 of FIG. 2A and have similar corresponding components; however, the system 400 includes a single-phase motor drive 418. The single-phase motor drive 418 is configured to generate a single-phase drive input 416. The V/I sensors 420 are configured to generate a sensed current and a sensed voltage as the sensed signals 422. The V/I phase detector 424 is configured to compare the phases of the sensed current and voltage signals 422 to generate the phase signal 426. A circuit similar to that of FIG. 2B may be used as the V/I phase detector 424; however, the sensed voltage 222-3 may be compared with ground or another fixed voltage to generate a signal with transitions a the zero-crossings of the sensed voltage 222-3. That signal may be AND'ed with the output 225-2 to generate phase signal 426 having a width that is dependent on the relative phase of the voltage and current of the signal phase drive input 416. In other embodiments, different circuits may be used to generate the phase signal 426 and the phase signal 426 may take forms other than encoding a pulse width with the phase information.

Figure 5A:
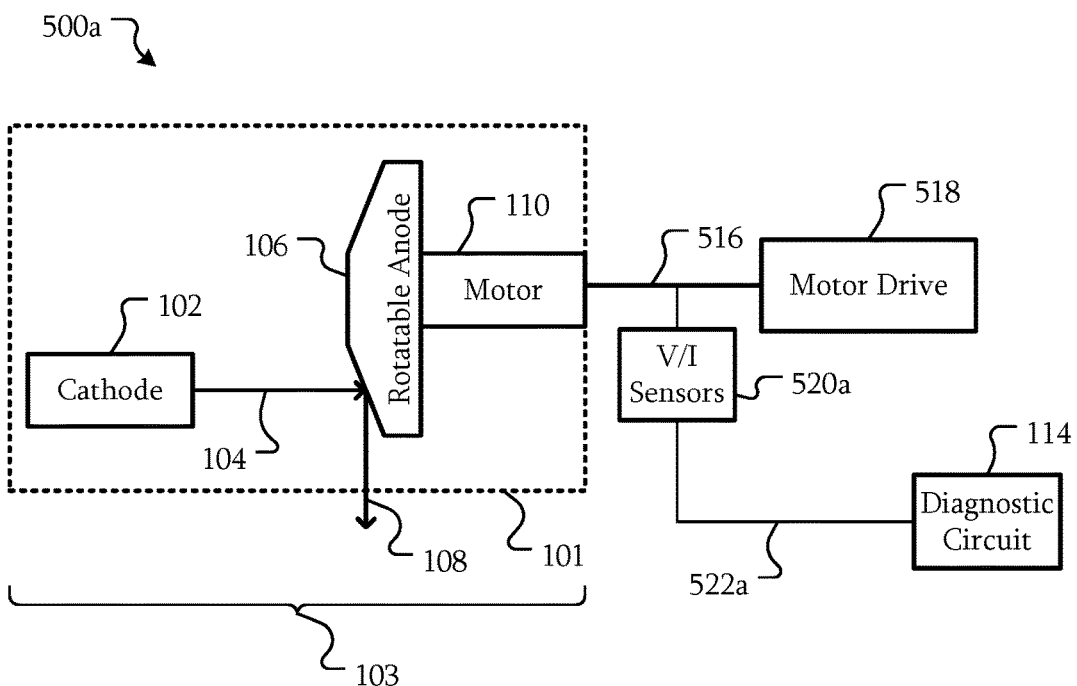
FIGS. 5A-C are examples of systems with various motor sensors according to some embodiments.
Figure 5B:
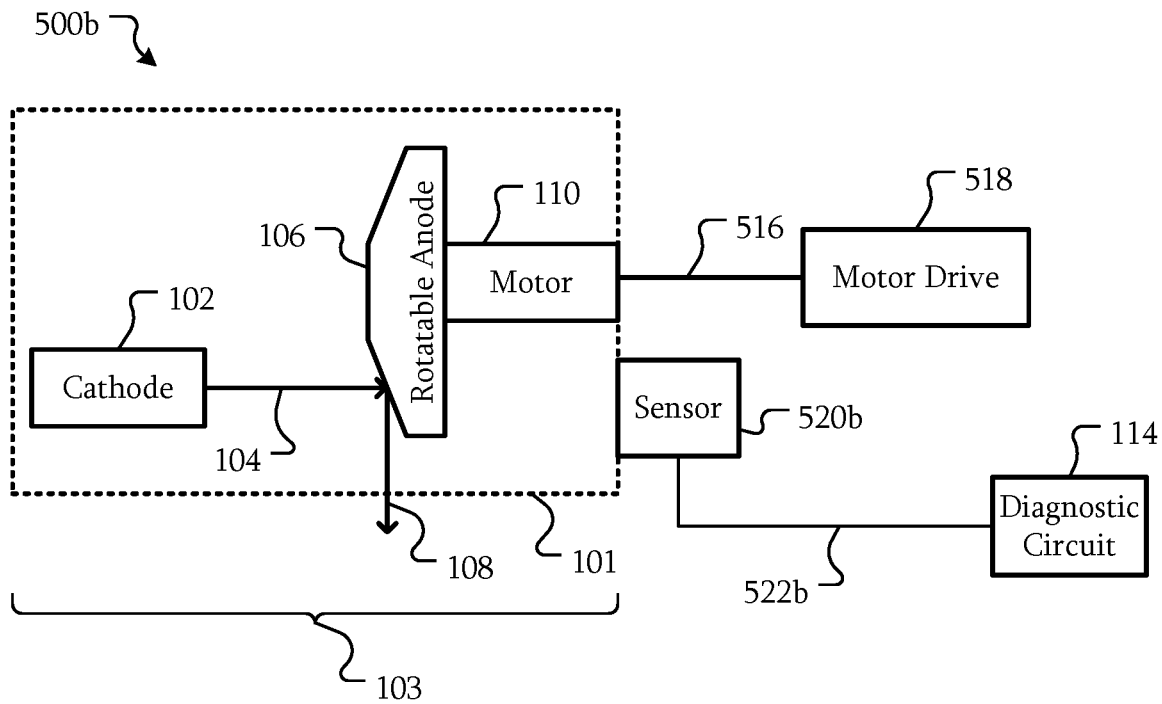
Figure 5C:
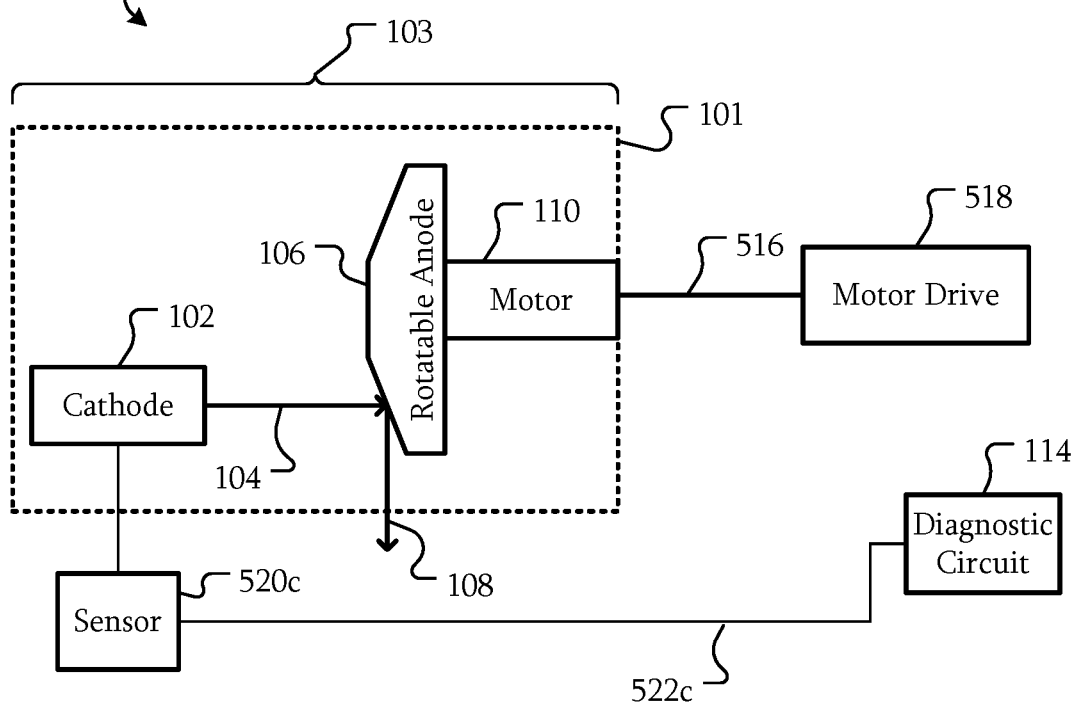
Figure 6:
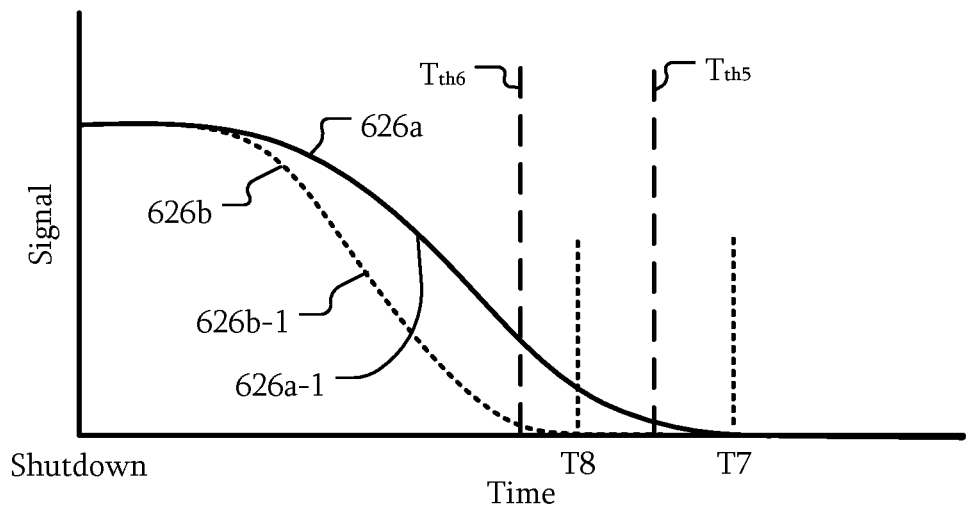
FIG. 6 is a chart illustrating an example of signals used in diagnosing an x-ray tube according to some embodiments.

FIGS. 5A-C are examples of systems with various motor sensors according to some embodiments. These examples illustrate different sensors that may be used in a manner similar to the relative phase described above. In these systems, a sensor is disposed outside of an enclosure 101 of a tube 103 and configured to receive a signal from the motor 110. As will be described in further detail below, the signal from the motor 110 may take a variety of forms. Regardless, as the signal may be indicative of a state of the motor 110, such as a speed of rotation, a time from shutdown of the motor 110 until the signal passes a threshold or reaches a steady state may be used as diagnostic information.

Referring to FIG. 5A, the system 500a may be similar to the system 100a, 100b, 200, and 400 described above. The V/I sensor(s) 520a may also be similar to corresponding V/I sensors 220 and 420. However, the V/I sensor(s) 520a may include one or more sensors that may be either current or voltage sensors. For example, the V/I sensor(s) 520 may include only a current sensor in some embodiments, only a voltage sensor in other embodiments, and both a current sensor and a voltage sensor in still other embodiments.

In response to the sensed signal(s) 522a from the V/I sensor(s) 520a, the diagnostic circuit 514 may be configured to generate an indication of a status of the motor 110 in response to the signal received from the motor 110. For example, the diagnostic circuit 114 may be configured to predict a remaining lifetime and/or indicate whether the x-ray tube 103 has failed.

Referring to FIG. 5B, the system 500b may be similar to the system 500a of FIG. 5A; however, the system 500b includes a sensor 520b that is not electrically connected to the motor 110. For example, the sensor 520b may be an acoustic sensor, a vibration sensor, or the like. As a result, the sensor 520b may be configured to generate a signal 522b based on the rotation of the motor 110. In some embodiments, the sensor 520b may be isolated from other structures or sources of noise and/or vibration that are unrelated to the motor 110 or rotatable anode 106.

Referring to FIG. 5C, in some embodiments, the system 500c may be similar to the system 500b described above. However, the sensor 520c may be configured to sense another aspect of the x-ray tube 103 that is indirectly affected by the motor 110 or the rotatable anode 106. For example, the rotation of the motor 110 and/or the rotatable anode 106 may induce a current in a filament of the cathode 102. The sensor 520c may be configured to sense this induced signal from the cathode 102. Although an induced signal sensed from the cathode 106 has been used as an example, the sensor 520c may be configured to sense an induced signal from another component of the x-ray tube 103.

FIG. 5D is a chart illustrating an example of signals used in diagnosing an x-ray tube according to some embodiments. The variety of sensors 520 described with respect to FIGS. 5A-5C may generate a corresponding signal 522 that is received by the diagnostic circuit 114. Similar to the time to steady state measurements of FIGS. 3B and 3C, a time to a steady state, zero value, or appropriate threshold may be used to indicate a status of the motor 110 and/or the x-ray tube 103. In some embodiments, after a gantry has stopped rotating, the motor 110 and rotatable anode 106 may still be rotating. The time until the motor 110 comes to a stop, the speed passes below a particular threshold, or reverses direction may be indicative of the status of the motor 110, such as a status of wear of the bearings.

The signal 526a represents the signal 522 or derived signals from a system that is operating normally. Similarly, the signal 526b represents the signal 522 or derived signals from a system that has a predictable, limited lifetime remaining. If the motor 110 is operating properly, the time until the motor 110 stops spinning, the speed passes a threshold, the noise or vibration level passes a threshold, or the like may be greater than a threshold time $T_{th5}$. Here, time T7 associated with signal 526a and a normally operating motor 110 is greater than the threshold time $T_{th5}$. However, the time T8 associated with signal 526b is less than the threshold time $T_{th5}$. Accordingly, the system that generated the signal 526b may have a predictable, limited lifetime remaining. Threshold time $T_{th6}$ is also illustrated as an example of a threshold for determining between a system that has some lifetime remaining or one that is failing or failed.

In some embodiments, the measurements may begin at a time that a rotating gantry has stopped rotating. This time corresponds to the shutdown time of FIG. 5D. In some embodiments, power to the motor 110 may be maintained until the gantry has stopped rotating; however, in other embodiments, the power to the motor 110 may be shut down substantially simultaneously.

In some embodiments, power to the motor 110 is shut down; however, in other embodiments, a relatively small amount of power may be applied to the motor 110 in a manner intended to reverse the direction of rotation of the motor 110. The time for the motor 110 to stop or reverse direction may be measured. In some embodiments, once the motor 110 reverses direction, the current and voltage relationship described above in FIG. 2C would reverse. This may be used to determine the time at which the motor stops or reverses direction.

Figure 7:
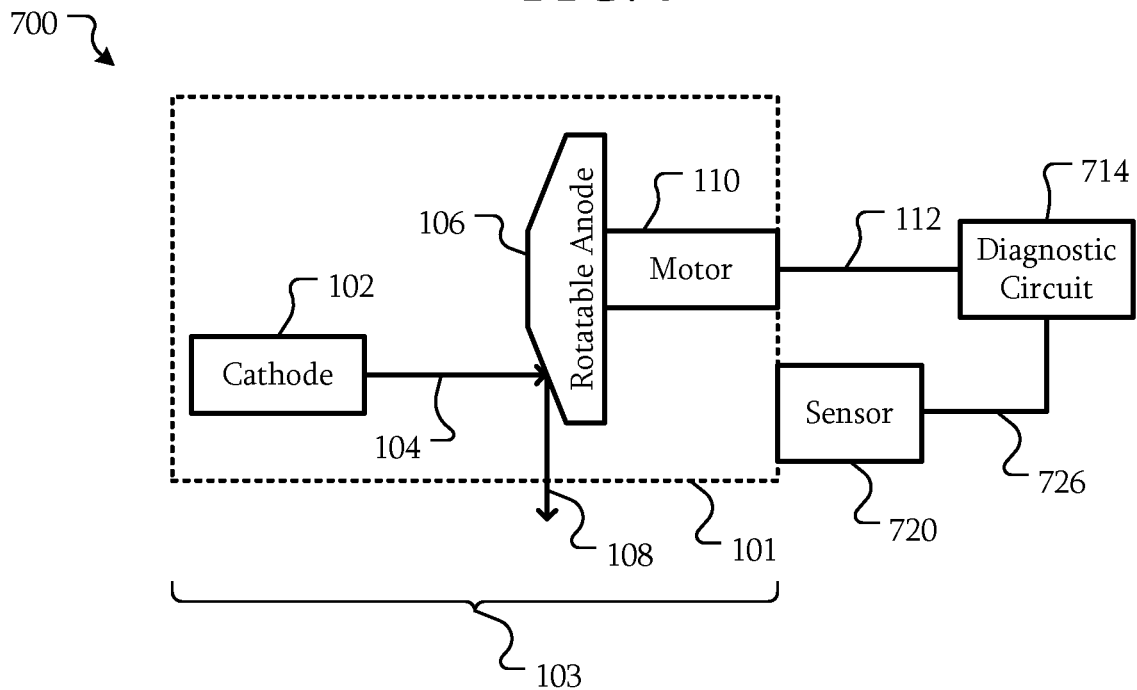
FIG. 7 is a block diagram of a system with a combination of types of sensors according to some embodiments.

FIG. 7 is a block diagram of a system with a combination of types of sensors according to some embodiments. In some embodiments, the system 700 may be similar to systems 100, 200, 400, and 500*a-c*. That is, the system 700 may have a diagnostic circuit 714 electrically connected to the motor 110 and configured as described with respect to systems 100, 200, 400, and 500*a-c* with the various sensors and other circuitry. In addition, the diagnostic circuit 714 is also connected to another sensor 720. This sensor 720 is an operating condition sensor 720. For example, the sensor 720 may be an accelerometer attached to the tube 103 or the gantry. In some embodiments, the sensor 720 may be a single axis accelerometer configured to sense radial acceleration; however, in other embodiments, the accelerometer may be configured to sense accelerations in multiple axes. In other embodiments, the sensor 720 may be a frequency detector configured to detect a frequency of a drive input provided to the motor 110. In other embodiments, the sensor 720 may be configured to generate a sensed signal 726 indicative of the centripetal acceleration. In other embodiments, multiple such sensors 720 may be present and configured to generate multiple sensed signal 726.

The sensed signal 726 may be combined with the data from the sensors associated with the motor 110 and used as described above to generate an indication of the status of the motor 110. For example, a sensed signal 726 indicative of the centripetal acceleration and a sensed signal 726 indicative of a frequency of rotation of the motor 110 may be used to select particular thresholds, values, ranges, or the like to compare with the phase, current, or the like as described above.

Figure 8:
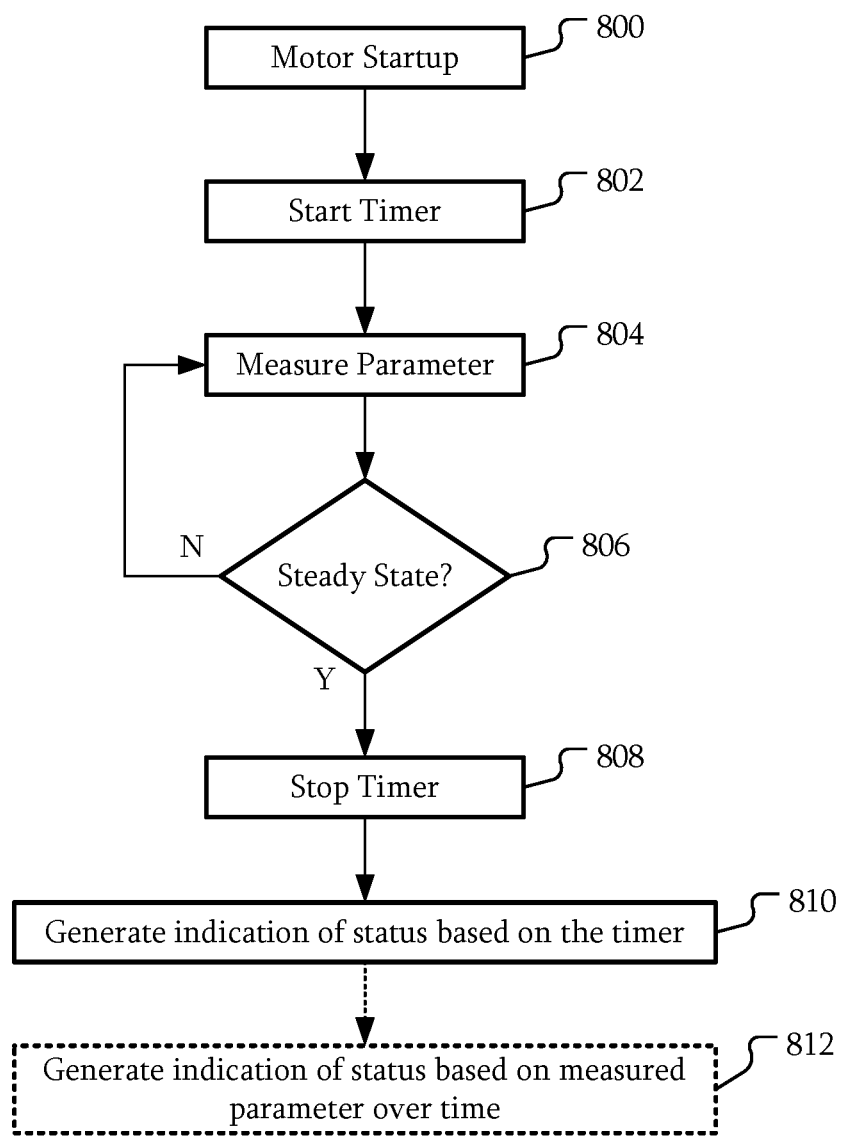
FIG. 8 is a flowchart illustrating a startup diagnostic procedure according to some embodiments.

FIG. 8 is a flowchart illustrating a startup diagnostic procedure according to some embodiments. Referring to FIG. 8 and the system of FIG. 1A as an example, in 800 the motor 110 is started. For example, the motor 110 may be started with a fixed amplitude drive input 116. At motor startup in 800, a timer is started in 802. The timer may include a circuit, register, software, or the like of the diagnostic circuit 114. A loop is performed to measure a parameter in 804 and determining if the measured parameter, such as a current, phase, rotational velocity, or the like of the motor 110, has reached a steady state in 806. For example, the diagnostic circuit 114 may periodically acquire a new measured parameter and process that measured parameter in conjunction with past measured parameters to determine if the measured parameter has reached a steady state. As described above, a steady state may be defined in a variety of ways.

If the measured parameter has reached a steady state, in 808, the timer is stopped. The value of the timer may then be used to generate an indication of status in 810. For example, the measured parameter may be the phase or current as described above. The time to steady state may be compared against the appropriate thresholds to generate the indication of status in 810.

In some embodiments, the measured parameter may be acquired over time while waiting for the steady state in 806. For example, values of the measured parameter over time may be stored in a memory of the diagnostic circuit 114. The measured parameter over time may be analyzed to generate a rate of change that is used to generate the indication of the status in 812. The indication of the status may be generated by comparing the rate of change to a threshold similar to the comparisons described above. This operation may be performed with or in the alternative to the operation in 810.

Figure 9:
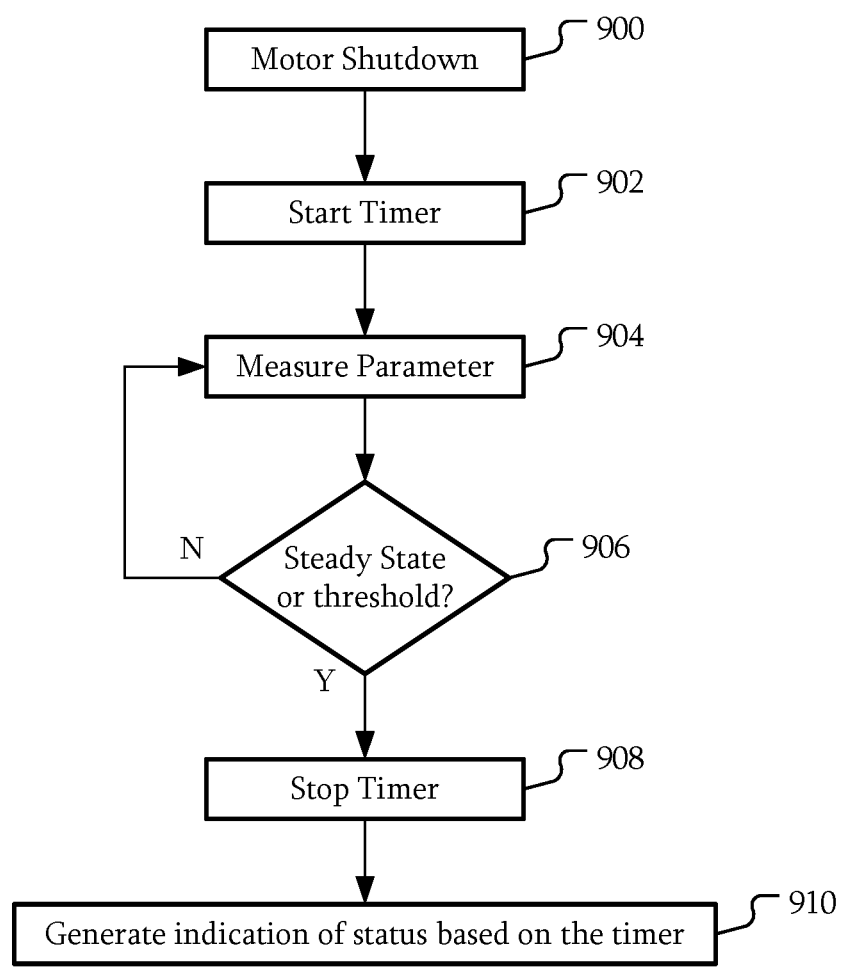
FIG. 9 is a flowchart illustrating a shutdown diagnostic procedure according to some embodiments.

FIG. 9 is a flowchart illustrating a shutdown diagnostic procedure according to some embodiments. Referring to FIG. 9 and the system of FIG. 1A as an example, in 900 the motor 110 is shutdown. Some operations of FIG. 9 may be similar to those of FIG. 8. For example, in 902 a timer is started. A loop is performed to measure the parameter in 904 and determine if it is in a steady state in 906. As described above, measured parameter may include a current, phase, rotational velocity, vibration, sound, or the like associated with the motor 110. Alternatively or in addition, the measured parameter may be compared to a threshold in 906. If the measured parameter has reached the steady state or passed the threshold, the timer is stopped in 908 and the value of the timer is used to generate an indication of the status in 910. Accordingly, the shutdown time may be used to generate an indication of the status as described above.

Figure 10:
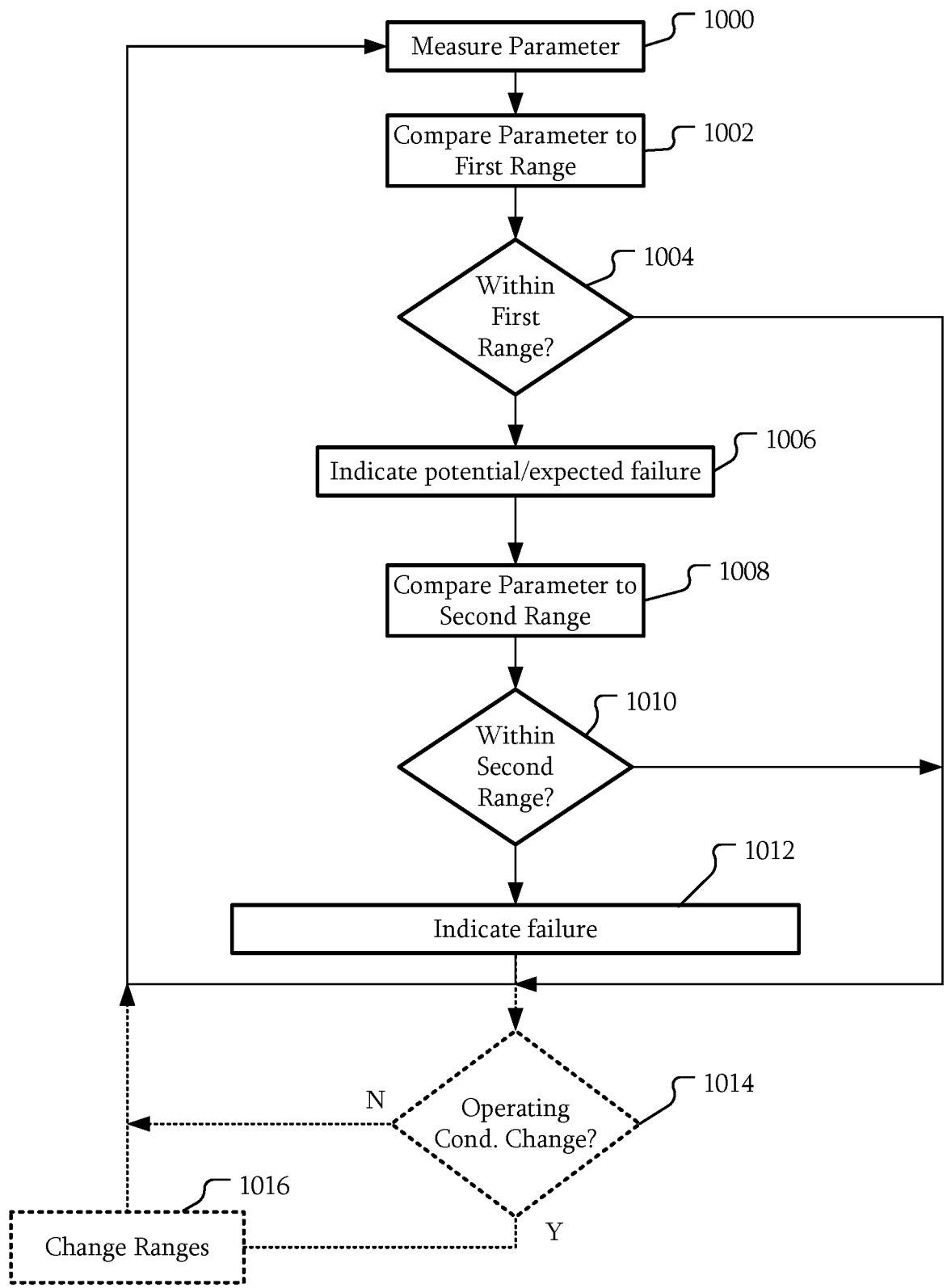
FIG. 10 is a flowchart illustrating an operating diagnostic procedure according to some embodiments.

FIG. 10 is a flowchart illustrating an operating diagnostic procedure according to some embodiments. Referring to FIG. 10 and the system of FIG. 1A as an example, in some embodiments, the diagnostic procedure is performed during operation. In 1000, a parameter is measured. The parameter is compared to a first range in 1002. If it is within that range in 1004, the procedure continues by measuring the parameter again in 1000.

If the parameter is not within the first range in 1004, a potential or expected failure is indicated in 1006. In 1008 the parameter is compared to a second range. The second range may be a range that indicates that the system has a predictable, limited lifetime remaining and has not yet failed. If the measured parameter is within the second range, the continues by measuring the parameter again in 1000. If the measured parameter is outside of the second range, a failure is indicated in 1012. Here, the operation continues, however, in other embodiments, the operation may stop.

In some embodiments, the ranges may be changed. In particular, if an operating condition changes in 1014, the ranges are changed in 1016. Accordingly, the ranges may be updated to reflect new nominal and predictive ranges based on the new operating conditions. As described above, the ranges may be changed in a variety of ways.

In some embodiments, the diagnostic information generated as described above may be used to begin a maintenance procedure before the x-ray tube 103 fails. Using the phase described above as a specific example, by tracking the phase shift over time, during startup, during shutdown, or the like, a prediction of whether and/or when the x-ray tube 103 will fail may be determined. This information may be used to schedule a time to replace the x-ray tube 103 during a scheduled downtime to reduce the impact on normal operation.

Moreover, the availability of the information in lieu of an actual failure and the availability in a digitized form allows for the information to be transmitted to a variety of destinations and used for a variety of purposes. For example, an operator of a facility may use the information to pre-order a replacement x-ray tube 103 and/or schedule the replacement during a lull in usage. In another example, a distributor may monitor one or more such system and schedule the delivery and/or schedule the replacement. In another example, statistical information may be collected from actual usage and the associated predicted failures of multiple systems in the field and/or in test setups.

Figure 11:
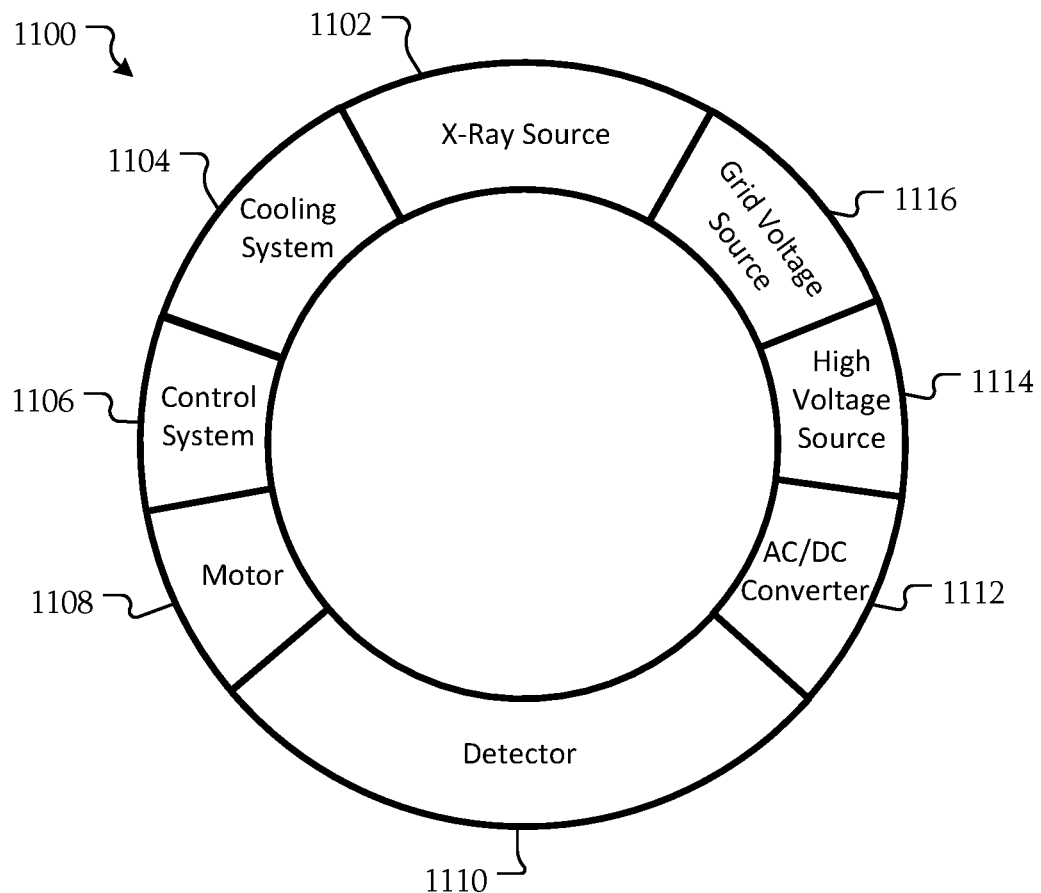
FIG. 11 is a block diagram of a computerized tomography (CT) gantry according to some embodiments.

FIG. 11 is a block diagram of a computerized tomography (CT) gantry according to some embodiments. In some embodiments, the CT gantry includes an x-ray source 1102, a cooling system 1104, a control system 1106, a motor drive 1108, a detector 1110, an AC/DC converter 1112, a high voltage source 1114, and a grid voltage source 1116. The x-ray source 1102 may include an x-ray tube 113 as described above. The control system 1106, motor drive 1108 or the like may include the various sensors and diagnostic circuits described above. Although particular components have been used as examples of components that may be mounted on a CT gantry, in other embodiments, the other components may be different. Although a CT gantry is used as an example of a system that includes the sensors and diagnostic circuits as described herein, sensors and diagnostic circuits described herein may be used in other types of systems with vacuum enclosures or other harsh environments having rotating internal structures.

Figure 12:
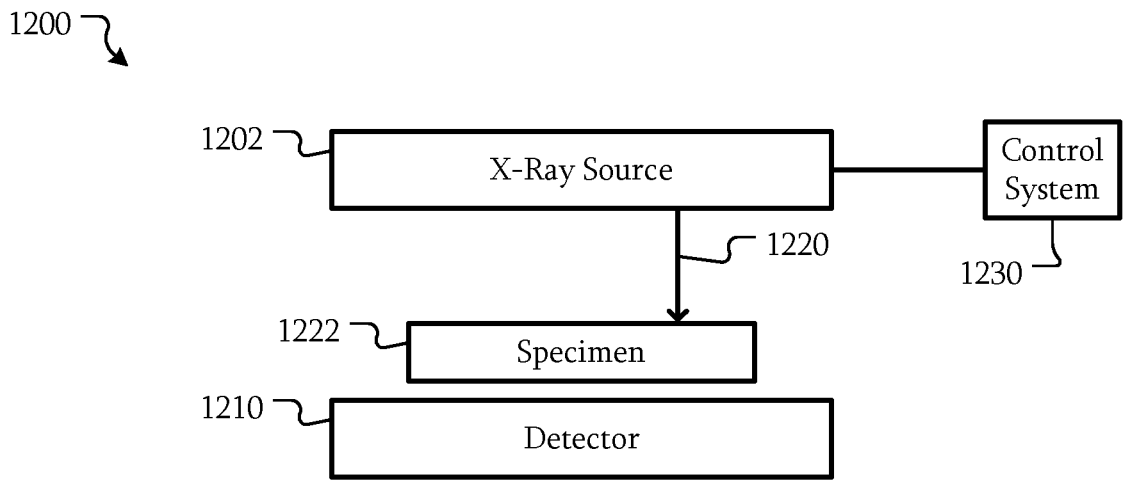
FIG. 12 is a block diagram of a 2D x-ray imaging system according to some embodiments.

FIG. 12 is a block diagram of a 2D x-ray imaging system according to some embodiments. The imaging system 1200 includes an x-ray source 1202 and a detector 1210. The x-ray source 1202 may include an x-ray tube 103 as described above. A control system 1030 connected to the x-ray source 1002 may include the various sensors and diagnostic circuits described above. The x-ray source 1202 is disposed relative to the detector 1210 such that x-rays 1220 may be generated to pass through a specimen 1222 and detected by the detector 1210.

Referring to FIGS. 1-12, some embodiments include a system, comprising an enclosure 101 configured to enclose a vacuum; a cathode 102 disposed within the enclosure 101; an anode 106 disposed within the enclosure 101 configured to receive a beam of electrons from the cathode 102; a motor 110 disposed within the enclosure 101 and configured to rotate the anode 106 in response to a drive input 116, 216, 416, 516; and a circuit electrically connected to the drive input 116, 216, 416, 516, and configured to generate a phase signal 226 based on a voltage of the drive input 116, 216, 416, 516 and a current of the drive input 116, 216, 416, 516, the phase signal 226 indicating a phase difference between the voltage of the drive input 116, 216, 416, 516 and the current of the drive input 116, 216, 416, 516. In some embodiments, the circuit is disposed outside of the enclosure 101.

In some embodiments, the drive input 116, 216, 416, 516 is a three-phase input including first, second, and third voltages, each with a phase difference from the other voltages; the circuit further comprises a first comparator 224-1 configured to generate a first pulse based on a comparison with the first voltage and the second voltage; and the circuit is configured to generate the phase signal 226 based on the first pulse.

In some embodiments, the circuit further comprises a second comparator 224-2 configured to generate a second pulse based on a current associated with the first voltage; and a logic circuit 224-3 configured to generate the phase signal 226 in response to the first pulse and the second pulse.

In some embodiments, the drive input 116, 216, 416, 516 is a single-phase input; the voltage of the drive input 116, 416, 516 is a voltage of the single-phase input; and the current of the drive input 116, 416, 516 is a current of the single-phase input.

In some embodiments, the system further comprises a diagnostic circuit 114 configured to receive the phase signal 226 and generate an indication of a status of the motor 110 in response to the phase signal 226.

In some embodiments, the system further comprises a rotatable gantry 1000 including the enclosure 101; an accelerometer configured to measure an acceleration of the rotatable gantry 1100; wherein the diagnostic circuit 114 is configured to generate the indication of the status of the motor 110 in response to the acceleration of the rotatable gantry 1100.

In some embodiments, the diagnostic circuit 114 is configured to compare the phase signal 226 to a range based on a previous state of the phase signal 226; and generate the indication of the status of the motor 110 in response to the comparison.

In some embodiments, the range is based on at least one of a frequency of rotation of the motor 110 a centripetal acceleration of a rotatable gantry 1100 including the enclosure 101.

In some embodiments, the diagnostic circuit 114 is further configured to measure a time from startup to steady state of the phase signal 226; and generate the indication of the status of the motor 110 in response to the time from startup to steady state of the phase signal 226.

In some embodiments, the diagnostic circuit 114 is further configured to measure a rate of change of the phase signal 226 from startup to steady state; and generate the indication of the status of the motor 110 in response to the rate of change of the phase signal 226 from startup to steady state.

A system, comprising an enclosure 101 configured to enclose a vacuum; a cathode 102 disposed within the enclosure 101; an anode 106 disposed within the enclosure 101 configured to receive a beam of electrons from the cathode 102; a motor 110 disposed within the enclosure 101 and configured to rotate the and receive a drive input 116, 216, 416, 516; a sensor and configured to receive a signal from the motor 110; and a circuit electrically connected to the sensor, and configured to generate an indication of a status of the motor 110 in response to the signal received from the motor 110. In some embodiments, the sensor and circuit are disposed outside of the enclosure 101.

In some embodiments, the circuit is configured to measure a time from when power supplied to the motor 110 is deactivated until the signal from the motor 110 passes a threshold; and generate the indication of the status of the motor 110 in response to the time.

In some embodiments, the sensor is an acoustic sensor; and the signal received from the motor 110 is an acoustic signal sensed by the acoustic sensor.

In some embodiments, the sensor is a voltage sensor; and the signal received from the motor 110 is a voltage sensed by the voltage sensor.

In some embodiments, the sensor is a current sensor coupled to the cathode 102; and the signal received from the motor 110 is a current sensed by the current sensor.

In some embodiments, the circuit is configured to measure a time from when power is supplied to the motor 110 until the signal from the motor 110 reaches a steady state; and generate the indication of the status of the motor 110 in response to the time.

In some embodiments, the signal from the motor 110 is a phase shift between a voltage driving the motor 110 and a current associated with the voltage.

In some embodiments, the circuit is configured to measure a rate of change of the signal from the motor 110 from when power is supplied to the motor 110 until the signal from the motor 110 reaches a steady state; and generate the indication of the status of the motor 110 in response to the rate of change.

Some embodiments include a method, comprising operating a motor 110 within an enclosure 101 of an x-ray tube enclosing a vacuum; measuring a phase shift between a voltage and a current driving a motor 110 during operation; and generating an indication of a status of the motor 110 in response to the phase shift.

In some embodiments, the method further comprises changing operating conditions of the x-ray tube to new operating conditions; and generating the indication of the status of the motor 110 in response to the new operating conditions.

Some embodiments include a system, comprising means for operating a motor within an enclosure of an x-ray tube enclosing a vacuum; means for measuring a phase shift between a voltage and a current driving a motor during operation; and means for generating an indication of a status of the motor in response to the phase shift.

Examples of the means for operating a motor within an enclosure of an x-ray tube enclosing a vacuum include the motor drives 118, 218, 418, and 518.

Examples of the means for measuring a phase shift between a voltage and a current driving a motor during operation include the diagnostic circuit 114, V/I sensors 220 and 420, V/I phase detector 224 and 424.

Examples of the means for generating an indication of a status of the motor in response to the phase shift include the diagnostic circuit 114.

In some embodiments, the method further comprises means for changing operating conditions of the x-ray tube to new operating conditions; and means for generating the indication of the status of the motor in response to the new operating conditions.

Examples of the means for changing operating conditions of the x-ray tube to new operating conditions include motor drives 118, 218, 418, and 518.

Examples of the means for generating the indication of the status of the motor in response to the new operating conditions include the diagnostic circuit 114.

Although the structures, devices, methods, and systems have been described in accordance with particular embodiments, one of ordinary skill in the art will readily recognize that many variations to the particular embodiments are possible, and any variations should therefore be considered to be within the spirit and scope disclosed herein. Accordingly, many modifications may be made by one of ordinary skill in the art without departing from the spirit and scope of the appended claims.

The claims following this written disclosure are hereby expressly incorporated into the present written disclosure, with each claim standing on its own as a separate embodiment. This disclosure includes all permutations of the independent claims with their dependent claims. Moreover, additional embodiments capable of derivation from the independent and dependent claims that follow are also expressly incorporated into the present written description. These additional embodiments are determined by replacing the dependency of a given dependent claim with the phrase "any of the claims beginning with claim [x] and ending with the claim that immediately precedes this one," where the bracketed term "[x]" is replaced with the number of the most recently recited independent claim. For example, for the first claim set that begins with independent claim 1, claim 3 can depend from either of claims 1 and 2, with these separate dependencies yielding two distinct embodiments; claim 4 can depend from any one of claim 1, 2, or 3, with these separate dependencies yielding three distinct embodiments; claim 5 can depend from any one of claim 1, 2, 3, or 4, with these separate dependencies yielding four distinct embodiments; and so on.

Recitation in the claims of the term "first" with respect to a feature or element does not necessarily imply the existence of a second or additional such feature or element. Elements specifically recited in means-plus-function format, if any, are intended to be construed to cover the corresponding structure, material, or acts described herein and equivalents thereof in accordance with 35 U.S.C. § 112 ¶6. Embodiments of the invention in which an exclusive property or privilege is claimed are defined as follows.

The invention claimed is:

1. A system, comprising:
   an enclosure configured to enclose a vacuum;
   a cathode disposed within the enclosure;
   an anode disposed within the enclosure configured to receive a beam of electrons from the cathode;
   a motor disposed within the enclosure and configured to rotate the anode in response to a drive input; and
   a circuit electrically connected to the drive input, and configured to generate a phase signal based on a voltage of the drive input and a current of the drive input, the phase signal indicating a phase difference between the voltage of the drive input and the current of the drive input.

2. The system of claim 1, wherein:
   the drive input is a three-phase input including a first voltage, a second voltage, and a third voltage, each with a phase difference from the other voltages;
   the circuit further comprises a first comparator configured to generate a first pulse based on a comparison with the first voltage and the second voltage; and
   the circuit is configured to generate the phase signal based on the first pulse.

3. The system of claim 2, wherein the circuit further comprises:
   a second comparator configured to generate a second pulse based on a current associated with the first voltage; and
   a logic circuit configured to generate the phase signal in response to the first pulse and the second pulse.

4. The system of claim 1, wherein:
   the drive input is a single-phase input;
   the voltage of the drive input is a voltage of the single-phase input; and
   the current of the drive input is a current of the single-phase input.

5. The system of claim 1, further comprising a diagnostic circuit configured to receive the phase signal and generate an indication of a status of the motor in response to the phase signal.

6. The system of claim 5, further comprising:
   a rotatable gantry including the enclosure; and
   an accelerometer configured to measure an acceleration of the rotatable gantry;
   wherein the diagnostic circuit is configured to generate the indication of the status of the motor in response to the acceleration of the rotatable gantry.

7. The system of claim 5, wherein the diagnostic circuit is configured to:
   compare the phase signal to a range based on a previous state of the phase signal; and
   generate the indication of the status of the motor in response to the comparison.

8. The system of claim 7, wherein:
the range is based on at least one of a frequency of rotation of the motor and centripetal acceleration of a rotatable gantry including the enclosure.

9. The system of claim 5, wherein the diagnostic circuit is further configured to:
measure a time from startup to steady state of the phase signal; and
generate the indication of the status of the motor in response to the time from startup to steady state of the phase signal.

10. The system of claim 5, wherein the diagnostic circuit is further configured to:
measure a rate of change of the phase signal from startup to steady state; and
generate the indication of the status of the motor in response to the rate of change of the phase signal from startup to steady state.

11. A system, comprising:
an enclosure configured to enclose a vacuum;
a cathode disposed within the enclosure;
an anode disposed within the enclosure configured to receive a beam of electrons from the cathode;
a motor disposed within the enclosure and configured to rotate the anode and receive a drive input;
a sensor configured to receive a signal from the motor; and
a circuit electrically connected to the sensor, and configured to:
measure a time associated with the signal; and
generate an indication of a status of the motor in response to the time.

12. The system of claim 11, wherein the time associated with the signal is a time from when power supplied to the motor is deactivated until the signal from the motor passes a threshold.

13. The system of claim 12, wherein:
the sensor is an acoustic sensor; and
the signal received from the motor is an acoustic signal sensed by the acoustic sensor.

14. The system of claim 12, wherein:
the sensor is a voltage sensor; and
the signal received from the motor is a voltage sensed by the voltage sensor.

15. The system of claim 12, wherein:
the sensor is a current sensor coupled to the cathode; and
the signal received from the motor is a current sensed by the current sensor.

16. The system of claim 11, wherein the time associated with the signal is a time from when power is supplied to the motor until the signal from the motor reaches a steady state.

17. The system of claim 11, wherein the signal from the motor is a phase shift between a voltage driving the motor and a current associated with the voltage.

18. The system of claim 11, wherein the circuit is configured to:
measure a rate of change of the signal from the motor from when power is supplied to the motor until the signal from the motor reaches a steady state; and
generate the indication of the status of the motor in response to the rate of change.

19. A system, comprising:
means for operating a motor within an enclosure of an x-ray tube enclosing a vacuum;
means for measuring a phase shift between a voltage and a current driving a motor during operation; and
means for generating an indication of a status of the motor in response to the phase shift.

20. The system of claim 19, further comprising:
means for changing operating conditions of the x-ray tube to new operating conditions; and
means for generating the indication of the status of the motor in response to the new operating conditions.

* * * * *